United States Patent
Liu et al.

(10) Patent No.: US 9,960,314 B2
(45) Date of Patent: May 1, 2018

(54) INORGANIC SALT-NANOPARTICLE INK FOR THIN FILM PHOTOVOLTAIC DEVICES AND RELATED METHODS

(71) Applicant: Nanoco Technologies Ltd., Manchester (GB)

(72) Inventors: Zugang Liu, Kidlington (GB); Cary Allen, Stockport (GB)

(73) Assignee: Nanoco Technologies Ltd., Manchester (GB)

(*) Notice: Subject to any disclaimer, the term of this patent is extended or adjusted under 35 U.S.C. 154(b) by 0 days. days.

(21) Appl. No.: 14/480,327

(22) Filed: Sep. 8, 2014

(65) Prior Publication Data
US 2015/0079720 A1    Mar. 19, 2015

Related U.S. Application Data

(60) Provisional application No. 61/877,725, filed on Sep. 13, 2013.

(51) Int. Cl.
*H01L 31/18* (2006.01)
*H01L 31/0272* (2006.01)
(Continued)

(52) U.S. Cl.
CPC ........ *H01L 31/1864* (2013.01); *C09D 11/322* (2013.01); *C09D 11/52* (2013.01);
(Continued)

(58) Field of Classification Search
CPC .......... H01L 31/1864; H01L 21/02568; C09D 11/30; Y02E 10/541
(Continued)

(56) References Cited

U.S. PATENT DOCUMENTS 5,223,026 A * 6/1993 Schwarz, Jr. .......... C09D 11/30
                                                    106/31.35
6,127,202 A  10/2000 Kapur et al.
(Continued)

FOREIGN PATENT DOCUMENTS

CN    1241804       1/2000
CN    101944556 A   1/2011
(Continued)

OTHER PUBLICATIONS

Database WPI Week 201128 Thomson Scientific, London, GB; AN 2011-C48785 XP802731261,& CN 101 944 556 A (Zhejiang Shangyue Opto Electronic Sci&) Jan. 12, 2811 (2011-81-12) abstract & CN 101 944 556 (Zhejiang Shangyue Opto Electronic Sci&) Jan. 12, 2011 (2811-81-12) paragraphs [0005]- [0010], [8814]- [8016], [8818], [8028]- [8832].
(Continued)

*Primary Examiner* — Moazzam Hossain
(74) *Attorney, Agent, or Firm* — Blank Rome, LLP

(57) ABSTRACT

Compositions for solution-based deposition of CIGS films are described. The compositions include ternary, quaternary or quinary chalcogenide nanoparticles (i.e., CIGS nanoparticles) and one or more inorganic salts dissolved or dispersed in a solvent to form an ink. The ink can be deposited on a substrate by conventional coating techniques and then annealed to form a crystalline layer. Further processing can be employed to fabricate a PV device. The inorganic salts are included to (i) tune the stoichiometry of the CIGS precursor ink to a desirable ratio, thus tuning the semiconductor band gap, to (ii) dope the CIGS layer with additives, such as Sb and/or Na, to promote grain growth, and/or to (iii) modify and improve the coating properties of the CIGS precursor ink.

13 Claims, 5 Drawing Sheets

(51) Int. Cl.
  *C09D 11/52* (2014.01)
  *H01L 31/032* (2006.01)
  *C09D 11/322* (2014.01)

(52) U.S. Cl.
  CPC ...... *H01L 31/0272* (2013.01); *H01L 31/0322* (2013.01); *Y02E 10/541* (2013.01)

(58) Field of Classification Search
  USPC .................................... 438/63; 257/E31.032
  See application file for complete search history.

(56) References Cited

U.S. PATENT DOCUMENTS

| | | | |
|---|---|---|---|
| 8,231,848 | B1 | 7/2012 | Ren et al. |
| 9,466,743 | B2 | 10/2016 | Harris et al. |
| 2007/0092648 | A1* | 4/2007 | Duren ................. C23C 18/1204 427/255.31 |
| 2007/0122331 | A1* | 5/2007 | Amirzadeh-Asl ........ C09C 3/08 423/274 |
| 2008/0257201 | A1 | 4/2008 | Harris et al. |
| 2008/0207774 | A1* | 8/2008 | Krishnan ................. A61K 8/11 514/772.6 |
| 2009/0139574 | A1 | 6/2009 | Pickett et al. |
| 2009/0260670 | A1 | 10/2009 | Li |
| 2011/0207297 | A1* | 8/2011 | Yaginuma ............. C23C 14/185 438/478 |
| 2012/0282730 | A1 | 11/2012 | Cho et al. |
| 2013/0284270 | A1* | 10/2013 | Zhang ................. H01L 31/0322 136/262 |
| 2013/0316519 | A1* | 11/2013 | Mitzi ................. H01L 21/02422 438/478 |
| 2014/0144500 | A1 | 5/2014 | Cao et al. |
| 2015/0303346 | A1* | 10/2015 | Teraji ................. C23C 14/0623 438/95 |

FOREIGN PATENT DOCUMENTS

| | | |
|---|---|---|
| CN | 102024858 A | 4/2011 |
| EP | 2647595 A2 | 10/2013 |
| JP | 2010225883 A | 7/2010 |
| JP | 2011165790 A | 8/2011 |
| JP | 2011187920 A | 9/2011 |
| WO | 2012011723 A2 | 1/2012 |
| WO | 2012071288 A1 | 5/2012 |
| WO | 2012138480 | 10/2012 |

OTHER PUBLICATIONS

Ahn et al: "Nucleation and growth of Cu(In ,Ga) Se2 nanoparticles in low temperature colloidal process", Thin Solid Films, Elsevier-Sequoia S.A. Lausanne, CH, vol. 515, No. 7-8, Feb. 15, 2007 (2007-{:}2-15), pp. 4036-4040 XP005890834, ISSN: 0040-6090, DOI:10.1016/J.TSF.2006 . 10 . 102 p. 4037, left-hand column p. 4039.

R. Kimura, T. Mouri, N. Takuhai, T. Nakada, S. Niki, A. Yamada, P. Fons, T. Matsuzawa, K. Takahashi and A. Kunioka, Jpn. J. Appl. Phys., 1999, 38, L899.

M. Yuan, D.B. Mitzi, W. Liu, A.J. Kellock, S.J. Chey and V.R. Deline, Chem. Mater., 2010, 22, 285.

F. Hergert, S. Jost, R. Hock, M. Purwins and J. Palm, Thin Solid Films, 2007, 515, 5843.

M. Yuan, D.B. Mitzi, O. Gunawan, A.J. Kellock, S.J. Chey and V.R. Deline, Thin Solid Films, 2010, 519, 852.

Guo, Q., et al., (2009), "Sulfide Nanocrystal Inks for Dense Cu(In1-xGax)(S1-ySEy)s Absorber Films and Their Photovoltaic Performance", Nano Letters, vol. 9, No. 8, pp. 3060-3065.

Gupta, R.J., et al., (1988), "Growth, synthesis and characterization of large grain CuInSe2 in bulk and thin film form Journal of Crystal Growth", vol. 87, Issue 1, pp. 151-153.

* cited by examiner

INORGANIC SALT-NANOPARTICLE INK FOR THIN FILM PHOTOVOLTAIC DEVICES AND RELATED METHODS

FIELD OF THE INVENTION

The invention relates to copper indium gallium diselenide/disulphide-(CIGS)-based thin film photovoltaic devices. The invention further relates to CIGS-based devices formed from nanoparticle-based precursor inks

BACKGROUND

There is strong interest in solar energy as an alternative to fossil fuels. But solar cells, also known as photovoltaic (PV) cells, must generate electricity at a competitive cost to fossil fuels, to be commercially viable. To be competitive, PV cells must utilize low cost materials, be inexpensive to make, and have moderate to high conversion efficiency of sunlight to electricity. Moreover, all aspects of making the PV cells must be commercially scalable.

The photovoltaic market is presently dominated by silicon wafer-based solar cells (first-generation solar cells). The active layer in those solar cells utilizes single crystal silicon wafers having a thickness of microns to hundreds of microns. Silicon is a relatively poor absorber of light. Single-crystal silicon wafers are very expensive to produce because the process involves fabricating and slicing high-purity, single-crystal silicon ingots. The process is also very wasteful. For those reasons, much development work has focused on producing high efficiency thin film solar cells having material costs significantly lower than silicon.

Semiconductor materials like copper indium gallium diselenides and sulphides ($Cu(In,Ga)(S,Se)_2$, herein referred to as "CIGS") are strong light absorbers and have band gaps that match the optimal spectral range for PV applications. Furthermore, because those materials have strong absorption coefficients, the active layer only a few microns thick can be used in a solar cell.

Copper indium diselenide ($CuInSe_2$) is one of the most promising candidates for thin film PV applications due to its unique structural and electrical properties. Its band gap of 1.0 eV is well matched with the solar spectrum. $CuInSe_2$ solar cells can be made by selenisation of $CuInS_2$ films. During the selenisation process, Se replaces S and the substitution creates volume expansion, which reduces void space and reproducibly leads to a high quality, dense $CuInSe_2$ absorber layers. [Q. Guo, G. M. Ford, H. W. Hillhouse and R. Agrawal, *Nano Lett.*, 2009, 9, 3060] Assuming complete replacement of S with Se, the resulting lattice volume expansion is ~14.6%, calculated based on the lattice parameters of chalcopyrite (tetragonal) $CuInS_2$ (a=5.52 Å, c=11.12 Å) and $CuInSe_2$ (a=5.78 Å, c=11.62 Å). This means that the $CuInS_2$ nanocrystal film can be easily converted to a predominantly selenide material, by annealing the film in a selenium-rich atmosphere. Therefore, $CuInS_2$ can be used as a precursor for $CuInSe_2$ or $CuIn(S,Se)_2$ absorber layers.

The theoretical optimum band gap for solar absorber materials is in the region of 1.2-1.4 eV. By incorporating gallium into $CuIn(S,Se)_2$ nanoparticles, the band gap can be manipulated such that, following selenization, a $Cu_xIn_yGa_zS_aSe_b$ absorber layer is formed with an optimal band gap for solar absorption.

Conventionally, costly vapor phase or evaporation techniques (for example metal-organic chemical vapor deposition (MO-CVD), radio frequency (RF) sputtering, and flash evaporation) have been used to deposit the CIGS films on a substrate. While these techniques deliver high quality films, they are difficult and expensive to scale to larger-area deposition and higher process throughput. Thus, less expensive and more flexible methods of producing the component layers in PV cells are desirable.

SUMMARY

Compositions for solution-based deposition of CIGS films are described. The compositions include ternary, quaternary or quinary chalcogenide nanoparticles (i.e., CIGS nanoparticles) and one or more inorganic salts dissolved or dispersed in a solvent to form an ink. The ink can be deposited on a substrate by conventional coating techniques and then annealed to form a crystalline layer. Further processing can be employed to fabricate a PV device. The inorganic salts are included to (i) tune the stoichiometry of the CIGS precursor ink to a desirable ratio, thus tuning the semiconductor band gap, to (ii) dope the CIGS layer with additives, such as antimony (Sb) and/or sodium (Na), to promote grain growth, and/or to (iii) modify and improve the coating properties of the CIGS precursor ink.

DESCRIPTION

Figure 1:
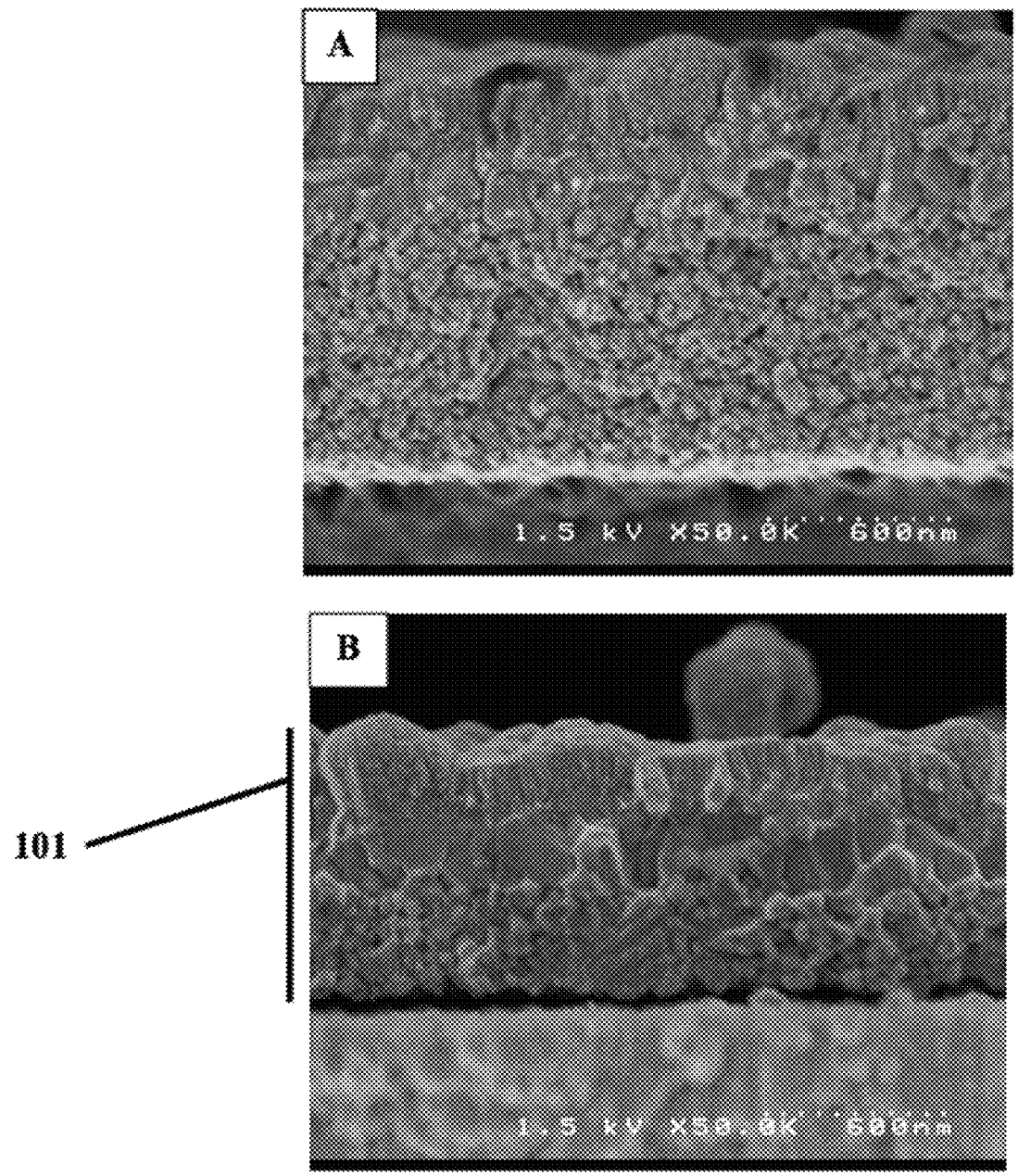
FIG. 1 shows SEM images of CIGS films prepared in the absence (A) and in the presence (B) of $SbCl_3$ in the nanoparticle ink formulation. In the presence of Sb, larger grains can be observed in the CIGS absorber layer (101).

Herein, a method to deposit a CIGS-based film, and subsequent processing to form a PV device, is described. The term "CIGS" should herein be understood to describe any material of the form $Cu_wIn_xGa_{1-x}Se_yS_{2-y}$, wherein $0.1 \leq w \leq 2$; $0 \leq x \leq 1$ and $0 \leq y \leq 2$. The value ranges of w, x and y are approximations; in other words, the material need not be stoichiometric.

The method involves forming a solution or dispersion of ternary, quaternary or quinary chalcogenide nanoparticles and one or more inorganic salts, dissolved or dispersed to form an ink. The ink is deposited on a substrate by conventional coating techniques and then thermally processed to first remove the solvent(s) and the ligands capping the nanoparticles and then to form a crystalline layer. The crystalline layer can serve as an absorber for PV device.

One of the major advantages of using nanoparticles to form CIGS films is that the nanoparticles can be dispersed in a medium to form an ink or paste that can be printed on a substrate in a similar way to printing newspapers. The nanoparticle ink or paste can be deposited using low-cost printing techniques such as spin coating, slit coating and doctor blading. Printing can replace the standard conventional vacuum-deposited methods of solar cell manufacture because printing processes, especially when implemented in a roll-to-roll processing framework, enables a much higher throughput.

Nanoparticles for use in the printing processes described herein are preferably on the order of about 2 to about 10 nm in diameter, have low melting points and narrow size distributions. The nanoparticles may incorporate a volatile capping agent on the surface of the nanoparticle that facilitates dispersion of the nanoparticles into the ink medium and may also facilitate the printing properties of the ink. Ideally, the capping agent can be eliminated easily during the film baking process. Examples of capping ligands include volatile organic molecules, such as $C_4$-$C_{16}$ hydrocarbons, which can generally be absorbed to the surface of the nanoparticles via —OH, —SH, or —SeH bonds. In other words, alcohols, thiols, and selenols are examples of suitable capping agents.

One of the challenges associated with the nanoparticle-based CIGS deposition approach is to achieve large grains after thermal processing. Grain sizes on the order of the film thickness are desirable since grain boundaries act as electron-hole recombination centers. Elemental dopants, such as sodium [R. Kimura, T. Mouri, N. Takuhai, T. Nakada, S. Niki, A. Yamada, P. Fons, T. Matsuzawa, K. Takahashi and A. Kunioka, *Jpn. J. Appl. Phys.*, 1999, 38, L899] and antimony, [M. Yuan, D. B. Mitzi, W. Liu, A. J. Kellock, S. J. Chey and V. R. Deline, *Chem. Mater.*, 2010, 22, 285] have been reported to enhance the grain size of CIGS films.

In CIGS films prepared by the sputtering of Cu—In—Ga precursors followed by selenisation, Na doping enhances crystal growth but also results in undesirable phase segregation of $CuInSe_2$ and $CuGaSe_2$. [F. Hergert, S. Jost, R. Hock, M. Purwins and J. Palm, *Thin Solid Films*, 2007, 515, 5843]. In contrast, the nanoparticle-based approach described herein, where the quaternary phase is inherent within the nanoparticles, enables Na-enhanced grain growth without phase segregation.

Mitzi and co-workers explored the incorporation of Sb into CIGS devices formed using a hydrazine solution-based deposition approach. Significant grain growth was observed using $Sb_2S_3$/S in hydrazine, with an improvement in power conversion efficiency (PCE) from 10.3% for undoped films to 12.3% for films doped with 0.2 mol. % Sb. [M. Yuan, D. B. Mitzi, W. Liu, A. J. Kellock, S. J. Chey and V. R. Deline, *Chem. Mater.*, 2010, 22, 285] At 1.2 mol. %, grain growth could be observed for films annealed at low temperatures (<400° C.). [M. Yuan, D. B. Mitzi, O. Gunawan, A. J. Kellock, S. J. Chey and V. R. Deline, *Thin Solid Films*, 2010, 519, 852] Despite the improvements in grain size and PCE with Sb doping, the deposition approach carries significant risk owing to the toxic and unstable nature of hydrazine.

Grain growth in $CuInSe_2$ thin films has also been reported upon doping of the $CuInSe_2$ flux with 2 wt. % cadmium or bismuth, followed by localized pulsed annealing using an electron beam. [R. J. Gupta, D. Bhattacharya and O. N. Sullivan, *J. Cryst. Growth*, 1988, 87, 151] Grain sizes of up to 10 μm were observed by transmission electron microscopy (TEM). However, pulsed annealing is difficult to scale. Additionally, doping with toxic cadmium is undesirable.

A further challenge associated with nanoparticle-based CIGS deposition is that the incorporation of certain elements into the nanoparticle can decrease the solubility of the nanoparticles in coating solvents, resulting in poor film quality. The processes described herein, wherein the element is provided as a component of an inorganic salt incorporated into the ink formulation avoids the solubility problems. The inorganic salt can be used to manipulate the stoichiometry of the final CIGS film without prior incorporation of the dopant element into the CIGS nanoparticle precursor. The elemental precursor becomes incorporated into the CIGS film during thermal processing.

As mentioned above, the role of the inorganic precursor(s) is to (i) tune the stoichiometry of the CIGS precursor ink to a desirable ratio, thus tuning the semiconductor band gap, to (ii) dope the CIGS layer with additives to promote grain growth, and/or to (iii) modify the coating properties of the CIGS precursor ink.

The band structure of the CIGS layer can be tuned by combining nanoparticles and one or more inorganic salts in a suitable molar ratio adjust the stoichiometry (and thus the band gap) of the CIGS layer. For example, an ink having x moles of $GaCl_3$ and one mole of $CuIn_{1-x}Se_2$ nanoparticles can be printed and annealed to form a CIGS layer with the stoichiometry $CuIn_{1-x}Ga_xSe_2$.

Further, the method can be used to fabricate multi junction cells, for which current matching between adjacent layers is important. Manipulating the film stoichiometry at the nanoparticle level is time consuming and costly, requiring the nanoparticle synthesis to be refined for each layer. Using the inorganic salt/nanoparticle ink approach described herein, $CuIn(S,Se)_2$ nanoparticles can be combined with varying amounts of $GaCl_3$ to formulate a series of CIGS inks with varying Ga/(Ga+In) ratio. The inks are deposited and processed with decreasing Ga concentration sequentially, such that the Ga concentration is highest at the CIGS/back contact interface and lowest at the CIGS/n-type semiconductor interface. Such compositional Ga grading allows the band gap and, therefore, the current collected, to be manipulated without altering the existing, optimized nanoparticle chemistry.

In a further example, gallium grading is achieved by first depositing $CuIn_yGa_{1-y}(S,Se)_2$ nanoparticles, then combining the nanoparticles with increasing amounts of $InCl_3$ to form an ink, which are deposited to form layers with a decreasing Ga/(In+Ga) ratio. In another example, an ink with excess $SeCl_4$ in conjunction with $Cu(In,Ga)S_2$ nanoparticles are formulated. The selenium ions from the $SeCl_4$ substitute sulfur sites in the CIGS lattice during thermal processing and/or compensate for any chalcogen loss at high temperature, to form a $Cu(In,Ga)(S,Se)_2$ or $Cu(In,Ga)Se_2$ layer.

Combining CIGS nanoparticles with one or more inorganic salts of elements known to promote grain growth, such as antimony and/or sodium, dope the CIGS layer with the grain growth-enhancing element(s) and thus promote growth of large grains under relatively mild thermal annealing and/or selenisation conditions. For example, an ink comprising one mole of $Cu(In,Ga)(S,Se)_2$ nanoparticles and z moles of $SbCl_3$ (where z<<1) can be used to form a doped CIGS layer: $Cu(In,Ga)(S,Se)_2$:Sb.

By formulating inks with a combination of nanoparticles and one or more inorganic salts, it is possible to achieve superior coating properties than for a nanoparticle-only ink. For example, the solubility of ternary chalcogenide nanoparticles and the inorganic precursor, e.g. $CuInSe_2+GaCl_3$, is higher than that of the corresponding quaternary chalcogenide nanoparticles, e.g. $Cu(In,Ga)Se_2$, allowing more uniform application of the ink to a substrate.

Exemplary absorber layers that can be prepared as described herein include $Cu(In,Ga)(S,Se)_2$; $Cu(In,Ga)(S,Se)_2$: Sb; $Cu(In,Ga)(S,Se)_2$:Na and $Cu(In,Ga)(S,Se)_2$:(Na, Sb) absorber layers. Synthesis of $Cu(In,Ga)(S,Se)_2$ nanoparticles is described in co-owned patent application Ser. No. 12/324,354, filed Nov. 26, 2008 (Pub. No. US 2009/0139574), the entire contents of which are incorporated herein by reference. Methods of preparing absorber layers from ink comprising nanoparticles are described in co-owned patent application Ser. No. 12/104,902, filed Apr. 17, 2008, (Pub. No. US 2008-0257201), the entire contents of which are incorporated herein by reference.

Generally, ink formulations containing nanoparticles and one or more inorganic salts are prepared by dissolving/dispersing nanoparticles and the one or more salts in a solvent. According to some embodiments, the nanoparticles can be dissolved/dispersed in a first solvent, to form an ink (A) and the inorganic salt can be dissolved/dispersed in a second solvent, which can be the same or different to the first solvent, to form a solution, B. Additional inks containing additional salts can be prepared, if needed. Alternatively, a single ink formulation containing the nanoparticles and one or more inorganic salts can be prepared by dissolving/dispersing all of the components into a single solvent.

The nanoparticles can be ternary, quaternary or quinary chalcogenides of the form $CuIn_{1-x}Ga_xSe_{2-y}S_y$, where $0 \leq x \leq 1$ and $0 \leq y \leq 2$, including doped species, alloys and combinations thereof, but are not restricted to those and can include non-stoichiometric derivatives thereof. The nanoparticles must be soluble or dispersible in the first solvent. The preparation of solution processable $Cu(In,Ga)(S,Se)_2$ nanoparticles is described in the applicant's co-pending U.S. Patent Publication No. 2009/0139574, referenced above.

The inorganic salt(s) are preferably soluble or dispersible in the second solvent. Preferred inorganic salts include, but are not restricted to, halides, acetates, acetylacetonates, hydroxides, sulphides, sulphates, phenyls, ethoxides and carbonates. For example, the inorganic salt can be a chloride such as, but not restricted to, NaCl, $GaCl_2$, $GaCl_3$, $InCl_3$, $SeCl_4$, and $SbCl_3$. When the inorganic salt, such as an Sb or Na salt, acts as a dopant, the doping concentration can be $\leq 2$ mol. %, more preferably 0.05-1 mol. %, and most preferably around 0.5 mol. %, relative to the number of moles of CIGS.

The first and second (and any additional) solvents may be the same or different, but generally must be miscible. The first solvent is generally capable of dissolving or dispersing the nanoparticles. Those skilled in the art will understand that the choice of solvent depends on the surface properties of the nanoparticles, such as the chemical nature of the ligands capping, if present. The first solvent is typically an organic solvent. One example is toluene, but other solvents known to those skilled in the art may be used, including, but not restricted to, alkanes (e.g. hexane), chlorinated solvents (e.g. dichloromethane, chloroform, etc.), ketones (e.g. isophorone), ethers (e.g. anisole), terpenes (e.g. α-terpinene, limonene, etc.), etc. The second (and additional) solvent(s) are generally capable of dissolving or dispersing the inorganic salt(s). Preferred examples include, but are not restricted to, toluene, alkanes (e.g. hexane), chlorinated solvents (e.g. dichloromethane, chloroform, etc.), ketones (e.g. isophorone), ethers (e.g. anisole), terpenes (e.g. α-terpinene, limonene, etc.), and polar solvents such as alcohols and water.

Optionally, further additives may be incorporated into the inorganic salt-nanoparticle ink, for example to modify the flowing properties, coating properties, rheology, surface tension, viscosity, or other properties of the ink. For example, the ink formulation may include one or more of a foam inhibiter, thickening agent, dispersing agent, surface tension modifier, or viscosity modifier. Examples of additives include fatty acids, polysiloxanes, polyols, surfactants, polyesters, and the like. According to some embodiments the ink includes oleic acid. Generally, oleic acid is used at a concentration between 2-5 wt. % of the total ink formulation.

Inks formulated as described above are used to form absorber layers of PV devices by depositing the ink on a substrate, which is generally the "back" electrode of the PV device. For example, the substrate may be indium tin oxide (ITO), molybdenum-coated bare glass, molybdenum-coated soda-lime glass (SLG), or the like. Any suitable method may be used to deposit the inorganic salt-nanoparticle ink. Examples include, but are not restricted to, spin coating, slit coating, doctor blading and inkjet printing.

Once deposited, each layer is annealed. One skilled in the art will realize that the annealing temperature and time following the deposition of each CIGS layer will depend on the nature of the solvent and organic components of the ink formulation. In certain embodiments, the films are annealed at a first, lower temperature in the region of 250-300° C., most preferably around 270° C., for between 3-7 minutes, most preferably around 5 minutes, then the films are subsequently annealed at a second, higher temperature in the region of 400-430° C., for example around 415° C., for between 3-7 minutes, most preferably around 5 minutes. The deposition and annealing steps may be repeated until the annealed film reaches a desired thickness. For example, deposition and annealing can be repeated until the film thickness is greater than or equal to 1 μm. For example, the film thickness can be in the range 1.0-2.0 μm. According to certain embodiments, further film processing steps may be performed, such as sintering, selenization, or the like, as required. According to certain embodiments, the film processing steps include a selenization process, during which the CIGS film is annealed in a selenium-rich atmosphere. Any suitable selenium source may be used to provide the selenium-rich atmosphere, such as a solid or liquid selenium compound that can be vaporized, or a gaseous selenium source. In a particular embodiment, the selenium-rich atmosphere is provided by $H_2Se$ gas at a concentration of $\leq 10\%$, more preferably 2-5%, in an inert carrier gas such as, but not restricted to, $N_2$.

Once the absorber layer is complete, the remainder of the PV device can be fabricated, as is known in the art. For example, an n-type semiconductor layer junction may be deposited on top of the CIGS absorber layer. Any suitable n-type semiconductor layer can be deposited. Examples include, but are not restricted to, CdS and ZnS. An extended depletion layer of a material such as ZnO, a window layer, and a metal grid for better charge collection, or the like, may be formed. In certain embodiments, the window layer consists of aluminum zinc oxide (AZO), but other transparent conducting oxides known to those skilled in the art, such as indium tin oxide (ITO), may be used.

EXAMPLES

Example 1: CIGS Thin Film Using Antimony Chloride-CuInS$_2$/CuInSe$_2$ Nanoparticle Ink (0.5 mol. % Sb)

CuInS$_2$ nanoparticles were prepared as described in U.S. patent application Ser. No. 14/195,651 (filed Mar. 3, 2014, the contents of which are incorporated herein by reference), capped with 1-octane thiol, and dissolved in toluene to form a 1.20 mM solution. CuInSe$_2$ nanoparticles capped with 1-octane selenol, prepared as described in U.S. Patent Publication No. 2009/0139574 (the contents of which are incorporated herein by reference), were dissolved in toluene to form a 1.25 mM solution. SbCl$_3$ was dissolved in toluene to form a 122 μM solution. The three solutions in toluene were combined in a 1:1:1 ratio to form ink, with a concentration of 0.5 mol. % Sb compared to the number of moles of Cu. Oleic acid was incorporated to improve the coating properties of the ink.

A layer of CuInS$_2$ was deposited on Mo-coated SLG substrates by spin coating at a concentration of 100 mg/mL, using a spin speed of 3,000 rpm. The layer was annealed at 415° C. for 5 minutes to remove the ligand, yielding a layer thickness of ~50 nm. Further layers of ink were deposited on top of the first layer by spin coating at a concentration of 400 mg/mL, using a spin speed of 3,000 rpm. The film was annealed at 415° C. for 5 minutes to remove the ligand. The process was repeated twice further.

The films were annealed under a selenium-rich atmosphere, using 2% H$_2$Se in N$_2$, at 500° C. for 60 minutes. FIG. 1 shows SEM images comparing films prepared in the absence of the Sb salt (A) and prepared according to Example 1, where the Sb salt was incorporated into the nanoparticle ink (B). In the presence of Sb, larger grains are observed within the CIGS layer (101).

Example 2: CIGS Thin Film Using Antimony Chloride-CuInS$_2$ Nanoparticle Ink (0.5 mol. % Sb)

CuInS$_2$ nanoparticles capped with 1-octane thiol were dissolved in toluene to form a solution. SbCl$_3$ was dissolved in toluene to form a solution. The two solutions in toluene were combined to form ink with a concentration of 0.5 mol. % Sb compared to the number of moles of Cu.

A layer of CuInS$_2$ was deposited on Mo-coated SLG substrates by spin coating at a concentration of 100 mg/mL, using a spin speed of 3,000 rpm. The layer was annealed at 415° C. for 5 minutes to remove the ligand, yielding a layer thickness of ~50 nm.

The ink was deposited on top of the first layer by spin coating at a concentration of 200 mg/mL, using a spin speed of 3,000 rpm. The film was annealed at 270° C. for 5 minutes, followed by 415° C. for 5 minutes to remove the ligand. The process was repeated nine times further. The films were annealed under a selenium-rich atmosphere, using H$_2$Se/N$_2$, at 500° C. or 520° C. for 60 minutes. H$_2$Se concentrations of 2% and 5% were used. The X-ray diffraction patterns (FIG. 2A-D, compared to the CuInSe$_2$ reference 40-1487 from the JCPDS database) show narrowing of the full-width at half-maximum (FWHM) of the (112) peak with the incorporation of Sb (B and D) relative to those films prepared in the absence of Sb (A and C), as summarized in Table 1. Narrowing of the peak FWHM is indicative of an increase in grain size.

TABLE 1

X-ray Diffraction of CIGS films.

Figure 2:
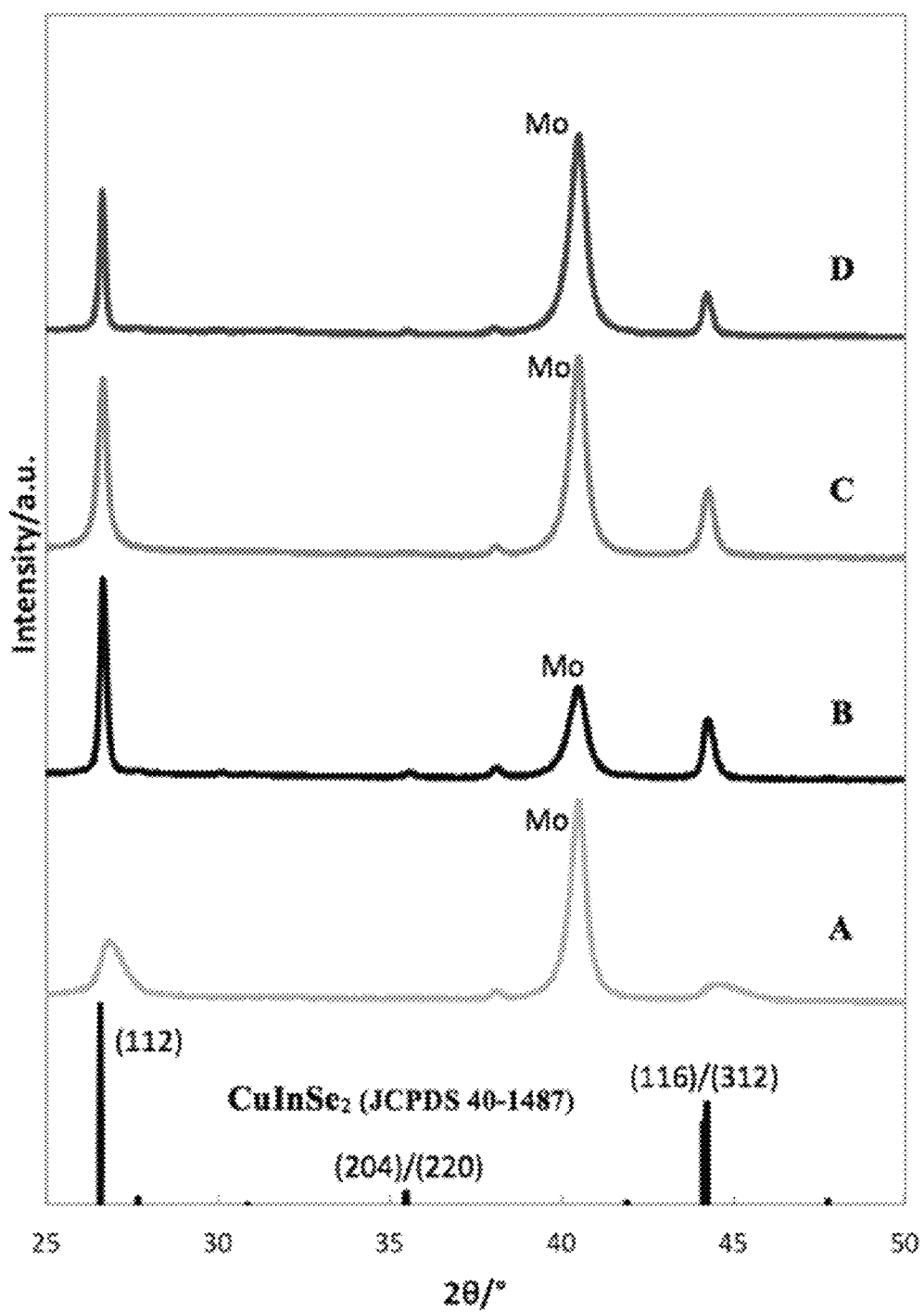
FIG. 2 shows the X-ray diffraction (XRD) pattern of CIGS films prepared in the absence (A, C) and in the presence (B, D) of $SbCl_3$ in the nanoparticle ink formulation. Also shown is a reference pattern for $CuInSe_2$ nanoparticles from the JCPDS database.

| DEVICE | Sb CONC$^N$/mol. % | SELENISATION COND$^N$S | (112) FWHM/° |
|---|---|---|---|
| A<br>FIG. 2 A | 0 | 500° C., 2% H$_2$Se | 0.89 |
| B<br>FIG. 2 B | 0.5 | 500° C., 2% H$_2$Se | 0.20 |
| C<br>FIG. 2 C | 0 | 520° C., 5% H$_2$Se | 0.32 |
| D<br>FIG. 2 D | 0.5 | 520° C., 5% H$_2$Se | 0.19 |

Example 3: CIGS Device Using an Antimony Chloride-CuInS$_2$ Nanoparticle Ink (0.2 mol. % Sb)

CuInS$_2$ nanoparticles capped with 1-octane thiol were dissolved in toluene to form a solution. SbCl$_3$ was dissolved in toluene to form a solution. The two solutions in toluene were combined to form an ink with a concentration of 0.2 mol. % Sb compared to the number of moles of Cu. A layer of CuInS$_2$ was deposited on Mo-coated SLG substrates by spin coating at a concentration of 100 mg/mL, using a spin speed of 3,000 rpm. The layer was annealed at 415° C. for 5 minutes to remove the ligand, yielding a layer thickness of ~50 nm.

Further ink was deposited on the first layer by spin coating at a concentration of 200 mg/mL, using a spin speed of 3,000 rpm. The film was annealed at 270° C. for 5 minutes, followed by 415° C. for 5 minutes to remove the ligand. The process was repeated nine times further. The films were annealed under a selenium-rich atmosphere, using 2% H$_2$Se in N$_2$, at 500° C. for 60 minutes. PV devices were formed by depositing a CdS layer, a transparent conducting oxide and an Al grid. Table 2 compares the performance (open-circuit voltage, V$_{OC}$, short circuit current, J$_{SC}$, fill factor, FF, and power conversion efficiency, PCE) of devices prepared in the presence of Sb to those prepared without Sb. With the addition of 0.2% Sb to the ink formulation, the PCE increased by almost 2%.

TABLE 2

PV Parameters.

| INK | V$_{OC}$/V | J$_{SC}$/mA cm$^{-2}$ | FF/% | PCE/% |
|---|---|---|---|---|
| CuInS$_2$ | 0.39 | 26.11 | 29.43 | 3.06 |
| CuInS$_2$ + SbCl$_3$ (0.2%) | 0.42 | 31.65 | 36.15 | 4.90 |

Example 4: CIGS Device Using Antimony Chloride-Cu(In,Ga)Se$_2$ Nanoparticle Ink (0.24 mol. % Sb)

CuIn$_{0.9}$Ga$_{0.4}$Se$_2$ nanoparticles capped with 1-octane selenol were dissolved in toluene to form a solution. SbCl$_3$ was dissolved in toluene to form a solution. The two solutions in toluene were combined to form an ink with a concentration of 0.24 mol. % Sb compared to the number of moles of Cu.

The ink was deposited on top of Mo-coated SLG substrates at a concentration of 200 mg/mL, using a spin speed of 3,000 rpm. The film was annealed at 270° C. for 5 minutes, followed by 415° C. for 5 minutes to remove the ligand. The process was repeated nine times further, to form a 1.3 μm film.

Figure 3:
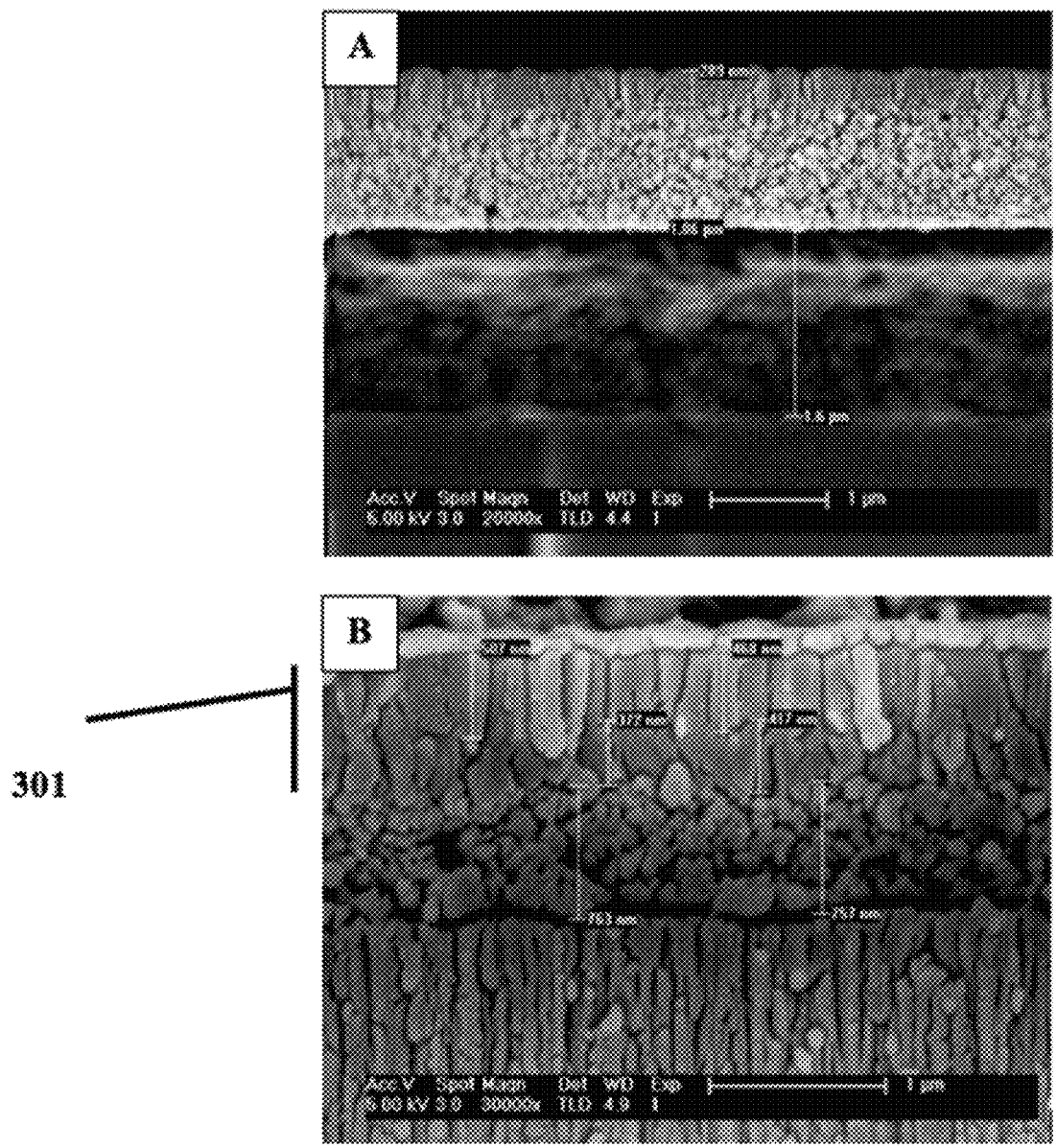
FIG. 3 shows SEM images of CIGS films prepared in the absence (A) and in the presence (B) of $SbCl_3$ in the nanoparticle ink formulation. In the presence of Sb doping, the CIGS absorber layer (301) shows grain sizes on the order of 400 nm.

The films were annealed under a selenium-rich atmosphere, using 2% $H_2Se$ in $N_2$, at 480° C. for 60 minutes. FIG. 3 shows SEM images comparing films prepared in the absence of the Sb salt (A) and prepared according to Example 3, where the Sb salt was incorporated into the nanoparticle ink (B). In the presence of Sb, larger grains are observed within the CIGS layer (301), with grain sizes on the order of 400 nm.

Example 5: CIGS Thin Film Using Gallium Chloride-CuInS$_2$ Nanoparticle Ink

Indium-deficient $CuIn_{0.79}S_2$ nanoparticles capped with 1-octane thiol were dissolved in toluene to form a solution. $GaCl_3$ was added to the nanoparticle solution and dissolved to form an ink targeting an In:Ga ratio of approximately 0.8:0.2.

A layer of $CuInS_2$ was deposited on Mo-coated SLG substrates by spin coating at a concentration of 100 mg/mL, using a spin speed of 3,000 rpm. The layer was annealed at 415° C. for 5 minutes to remove the ligand, yielding a layer thickness of ~50 nm.

The ink was deposited on top of the first layer by spin coating at a concentration of 145 mg/mL, using a spin speed of 3,000 rpm. The film was annealed at 270° C. for 5 minutes, followed by 415° C. for 5 minutes to remove the ligand. The process was repeated nine times further, yielding a layer thickness of ~2 μm. The films were annealed under a selenium-rich atmosphere, using 3.5% $H_2Se$ in $N_2$, at 520° C. for 60 minutes.

Figure 4:
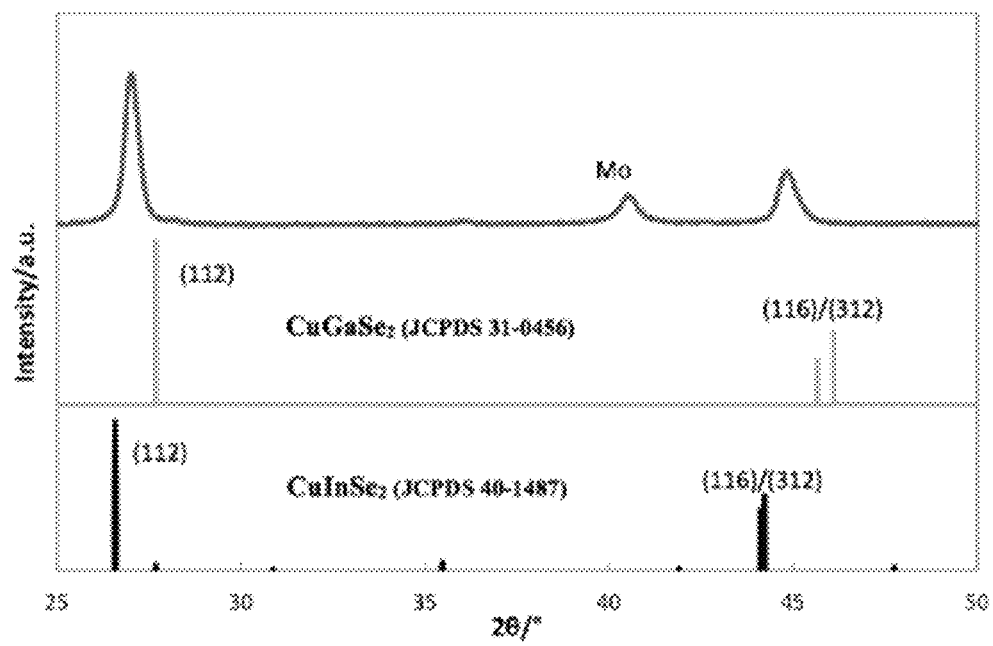
FIG. 4 shows the XRD pattern of a CIGS film prepared from a nanoparticle ink comprising $GaCl_3$ and $CuInS_2$ nanoparticles. Also shown are reference patterns for $CuInSe_2$ and $CuGaSe_2$ nanoparticles from the JCPDS database.

During selenisation, the Ga—CuInS$_2$ layer was converted to $CuIn_{1-x}Ga_x(S,Se)_2$ (x>0), as shown by the XRD pattern (FIG. 4), where the (112) and (116)/(312) peaks are shifted to higher angles than those of the $CuInSe_2$ reference (JCPDS 40-1487). A reference for $CuGaSe_2$ (JCPDS 31-0456) is also shown. The (112) peak was also shifted by over +0.2° compared to that of control samples prepared in the absence of $GaCl_3$, supporting the incorporation of Ga into the CIGS lattice.

Figure 5:
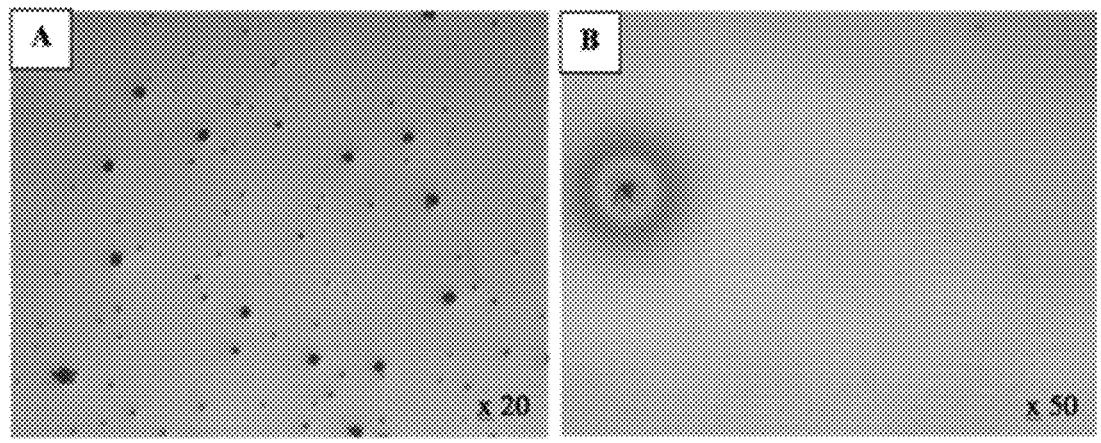
FIG. 5 shows microscopy images for a film coated with a nanoparticle ink prepared without $GaCl_3$ (A), at 20× magnification, and a film prepared with a nanoparticle ink comprising $GaCl_3$ (B), at 50× magnification.

The ink prepared with $GaCl_3$ showed superior coating properties to that without $GaCl_3$, as supported by microscopy images (FIG. 5). FIG. 5A shows a film coated with a nanoparticle ink prepared without $GaCl_3$, at 20× magnification, displaying spin marks, while FIG. 5B shows a film prepared with a nanoparticle ink comprising $GaCl_3$, at 50× magnification, displaying a more uniform surface coating.

Example 6: CIGS Device Using Gallium Chloride-CuInS$_2$ Ink (10 mol. % Ga)

Cu-deficient $CuIn_{1.1}S_2$ nanoparticles capped with 1-octane thiol were dissolved in toluene. $GaCl_3$ was combined with the nanoparticle solution to form an ink with a concentration of 10 mol. % Ga compared to the number of moles of Cu.

The ink was deposited on top of Mo-coated SLG substrates by spin coating at a concentration of 200 mg/mL, using a spin speed of 3,000 rpm. The film was annealed at 270° C. for 5 minutes, followed by 415° C. for 5 minutes to remove the ligand. The process was repeated ten times further, yielding a layer thickness of ~1.6 μm. The films were annealed under a selenium-rich atmosphere, using a 2% $H_2Se$ in $N_2$.

The films were prepared into solar cell devices, with $V_{OC}$=0.45 V and PCE=8.1%. Equivalent devices prepared in the absence of $GaCl_3$ had a $V_{OC}$ of 0.40 V and PCE of 4.8%. The increase in $V_{OC}$ in the presence of Ga is consistent with a widening of the semiconductor band gap.

Example 7: CIGS Thin Film Using Gallium Chloride-Antimony Chloride-CuInS$_2$ Nanoparticle Ink Indium-deficient $CuIn_{0.74}S_2$ nanoparticles capped with 1-octane thiol were dissolved in toluene to form a solution. $GaCl_3$ and $SbCl_3$ were added to the nanoparticle solution and dissolved to form an ink targeting a Cu:In:Ga:Sb ratio of approximately 1:0.74:0.26:0.005.

The ink was deposited on top Mo-coated SLG substrates by spin coating at a concentration of 200 mg/mL, using a spin speed of 1,500 rpm. The film was annealed at 270° C. for 5 minutes, followed by 415° C. for 5 minutes to remove the ligand. The process was repeated seven times further, yielding a layer thickness of ~1.1 μm.

Figure 6:
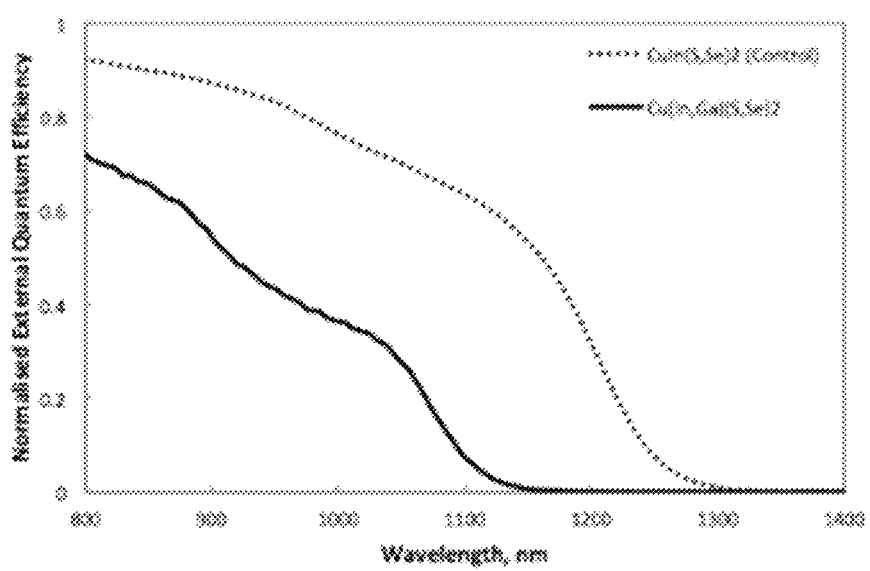
FIG. 6 compares the external quantum efficiency versus wavelength for $CuIn(S,Se)_2$ films prepared in the absence (control, dashed line) and in the presence (solid line) of Ga in the precursor ink. The absorption onset at shorter wavelength (higher energy) in the presence of Ga is indicative of widening of the semiconductor band gap due to the incorporation of Ga into the $CuIn(S,Se)_2$ absorber layer.

The films were annealed under a selenium-rich atmosphere, using 3.5% $H_2Se$ in $N_2$, at 520° C. for 60 minutes. During selenization, the Ga—Sb—CuInS$_2$ layer was converted to $CuIn_{1-x}Ga_x(S,Se)_2$:Sb (x>0), as shown by the absorption onset evaluated using external quantum efficiency measurements (see FIG. 6). The absorption onset at shorter wavelength (higher energy) of the selenized films in the presence of Ga, compared to a control prepared without Ga, is consistent with widening of the semiconductor band gap. The band gap energy can be tuned by adjusting the Ga/(In+Ga) ratio of the films, by changing the stoichiometry of the CuInS$_2$ nanoparticles and/or changing the molar percentage of Ga doping from the $GaCl_3$ salt.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

We claim:

1. A method of forming a crystalline semiconductor layer, the method comprising:
   providing an ink comprising a solvent, a population of nanoparticles having the formula $Cu_wIn_xGa_{1-x}Se_yS_{2-y}$, wherein 0.1≤w≤2, 0≤x≤1 and 0≤y≤2, an inorganic salt, and an additive,
   applying the ink to a substrate to form a film on the substrate,
   annealing the film to form the crystalline semiconductor layer,
   wherein the additive comprises one or more of a foam inhibitor, a thickening agent, a dispersing agent, a surface tension modifier, and a viscosity modifier.

2. The method of claim 1, wherein the nanoparticles are about 2 to about 10 nm in diameter.

3. The method of claim 1, wherein the inorganic salt comprises one or more of Cu, In, Ga, S and Se.

4. The method of claim 1, wherein the inorganic salt comprises Na or Sb.

5. The method of claim 1, wherein the inorganic salt is present at a concentration of about 0.05-10 mol. % relative to the moles of nanoparticles.

6. The method of claim 1, wherein applying the ink to a substrate comprises spin coating, doctor blading or inkjet printing.

7. The method of claim 1, wherein annealing comprises heating the substrate and the film at a temperature of about 250 to about 300° C.

8. The method of claim 1, wherein annealing comprises heating the substrate and the film at a first temperature for a first length of time then heating the substrate and the film at a second temperature for a second length of time.

9. The method of claim 1, wherein the nanoparticles comprise S and wherein annealing comprises heating the substrate and the film in the presence of Se.

10. The method of claim 1, wherein the substrate comprises indium tin oxide (ITO), molybdenum-coated glass, or molybdenum-coated soda-lime glass (SLG).

11. The method of claim 1, wherein the additive comprises a fatty acid, a polysiloxane, a polyol, a surfactant, or a polyester.

12. The method of claim 1, wherein the additive comprises oleic acid.

13. A method of forming a crystalline semiconductor layer, the method comprising:
    forming a population of nanoparticles having the formula $Cu_wIn_xGa_{1-x}Se_yS_{2-y}$, wherein $0.1 \leq w \leq 2$, $0 \leq x \leq 1$ and $0 \leq y \leq 2$;
    dispersing the population of nanoparticles, an inorganic salt, and an additive in a solvent to form an ink;
    applying the ink to a substrate to form a film on the substrate;
    annealing the film to form the crystalline semiconductor layer;
    wherein the additive comprises one or more of a foam inhibitor, a thickening agent, a dispersing agent, a surface tension modifier, and a viscosity modifier, and
    wherein the inorganic salt comprises any one of Ga, In, Se, Sb, and Na.

* * * * *